United States Patent [19]

Shockley

[11] 4,379,998

[45] Apr. 12, 1983

[54] ACOUSTIC DEGENERATE FOUR-WAVE MIXING PHASE-CONJUGATE REFLECTOR

[75] Inventor: Richard C. Shockley, San Diego, Calif.

[73] Assignee: The Standard Oil Company, Cleveland, Ohio

[21] Appl. No.: 277,448

[22] Filed: Jun. 25, 1981

[51] Int. Cl.³ .................... H03H 9/25; H03H 9/42; H03H 9/145

[52] U.S. Cl. ............................... 333/150; 333/153; 310/313 D; 357/26

[58] Field of Search ................... 333/150–155, 333/193–196; 330/4.5, 4.6; 364/821; 357/26; 310/313 R, 313 A, 313 B, 313 C, 313 D

[56] References Cited

U.S. PATENT DOCUMENTS

| | | | |
|---|---|---|---|
| 3,634,774 | 1/1972 | Carr | 330/4.6 |
| 3,833,867 | 9/1974 | Solie | 333/150 |
| 3,851,280 | 11/1974 | Staples | 333/150 |
| 3,882,408 | 5/1975 | Auld | 330/5.5 |
| 3,931,509 | 1/1976 | Otto | 333/150 X |
| 4,016,513 | 4/1977 | Solie | 333/154 |
| 4,181,904 | 1/1980 | Weller et al. | 357/26 X |

*Primary Examiner*—Marvin L. Nussbaum
*Attorney, Agent, or Firm*—William D. Mooney; Herbert D. Knudsen; Larry W. Evans

[57] ABSTRACT

An acoustic surface wave device is disclosed for generating an output signal that is the phase-conjugate of the input signal to the device. Disposed on the piezoelectric substrate is a first interdigital transducer for receiving a modulated input signal having a carrier center frequency $f_1$ and for converting the input signal to an input acoustic wave. A semiconductor material is disposed over the surface of the piezoelectric substrate. A second interdigital transducer is disposed on the surface of the piezoelectric substrate between the first interdigital transducer and the semiconductor material. A standing wave at frequency $f_1$ is generated by counterpropagating pump waves in the nonlinear acoustic wave interaction region in the area of the semiconductor material. The modulated input acoustic wave interacts with the counterpropagating pump waves in the nonlinear interaction region to generate an output signal on the output of the second interdigital transducer that is the phase-conjugate of the input signal.

11 Claims, 2 Drawing Figures

ACOUSTIC DEGENERATE FOUR-WAVE MIXING PHASE-CONJUGATE REFLECTOR

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates generally to the field of signal processing and, more specifically, to the problem of the generation of the phase-conjugate or time-reversal of an input signal. Still more specifically, the present invention relates to the generation of this phase-conjugate or time-reversed signal through the use of surface acoustic wave (SAW) devices.

Microwave traveling wave tubes are known to be capable of providing phase-conjugate reflections with identical features, i.e. described by the same equations. Microwave frequency surface wave devices have several advantages over their volume wave counterparts. Surface waves require only one optically polished surface whereas volume waves require two surfaces which must be parallel to optical tolerances. The fabrication techniques for surface wave transducers are the same as those used for integrated circuits so that SAW devices can be fabricated on a substrate together with transistor components. Also, SAW devices are inherently small, lightweight and rugged and are therefore particularly adapted to airborne and aero space applications. Additionally, SAW devices generally are not affected significantly by Joule heating problems.

No specific SAW devices have been reported utilizing the degenerate mixing of an input probe wave with two steady-state counterpropagated pump waves. However, SAW devices have been reported which achieve parametric amplification and four-wave interaction.

The earlier devices using piezoelectric semiconductor construction in which parametric amplification has been observed consist of a metal-insulator-semiconductor (MIS) structure, Al/Zn/SiO$_2$/Si. Across the device was an externally applied pump voltage at twice the frequency of the input acoustic wave which modulated the space charge layer in the silicon and hence the propagation properties of the acoustic wave which was launched from an interdigital transducer on the zinc oxide. Similar piezoelectric semiconductor devices using LiNbO$_3$ and Si have been constructed and tested in acoustoelectric experiments on memory devices and FM demodulators.

SUMMARY OF THE INVENTION

The present invention relates to an apparatus for exploiting the inherent or externally induced nonlinearity of surface or bulk acoustic waves to achieve parametric amplification and reflection of an input wave by counterpropagating pump waves. Such degenerate four-wave mixing provides unique signal transformation and alleviates certain difficulties present in alternative signal processing devices. The present invention is useful for a wide variety of UHF and VHF signal processing functions where a phase-conjugate output of an input signal is desired including pulse-integration, narrowband tunable amplification, and chirp removal or reversal. The present invention may provide a means for removing distortion in communication channels for satellite or TV applications as well as in ultrasonic imaging medical or industrial inspection methods and compensating for dispersion in surface acoustic wave resonators. It may also be useful in airborne or seaborne electronic countermeasures systems and producing special electronic musical effects.

The foregoing is accomplished by establishing, on a piezoelectric substrate, an input interdigital transducer for receiving a modulated carrier frequency signal and an output transducer colinearly aligned with the input interdigital transducer. The output transducer is situated between the input interdigital transducer and a semiconductor region formed over the surface of the piezoelectric substrate. Counterpropagating pump waves are generated to create a standing wave of frequency $f_1$ where $f_1$ is the center frequency of the modulated input signal. A nonlinear interaction region exists over the semiconductor region and the standing wave is propagated across this nonlinear interaction region. The input signal interacts with this standing wave in the nonlinear interaction region to generate at the output terminal of the output interdigital transducer an output signal that is the phase-conjugate of the input signal. The degenerate four-wave mixing method of the present invention produces unique phase-conjugate reflections under less stringent operating conditions than alternate methods. Specifically, phase-conjugation with three-wave interactions necessitates that delicate phase-matching criteria be satisfied. The present invention eliminates this problem by the use of two counterpropagating, degenerate pump waves to provide phase conjugation as well as parametric amplification of both forward traveling and backward traveling waves.

OBJECTS OF THE INVENTION

It is the primary object of the present invention to disclose a surface acoustic wave device capable of providing phase conjugation of an input signal by the use of two counterpropagating degenerate pump waves.

It is a further object of the present invention to disclose a new and useful surface acoustic wave device.

It is another object of the present invention to disclose a device that is capable of providing phase conjugation of an input signal in which the device may be effectively radiation hardened.

Other objects and many of the attendant advantages of this invention will be readily appreciated as the same becomes better understood by reference to the following detail description when considered in connection with the accompanying drawings.

DESCRIPTION OF THE PREFERRED EMBODIMENT

Figure 1:
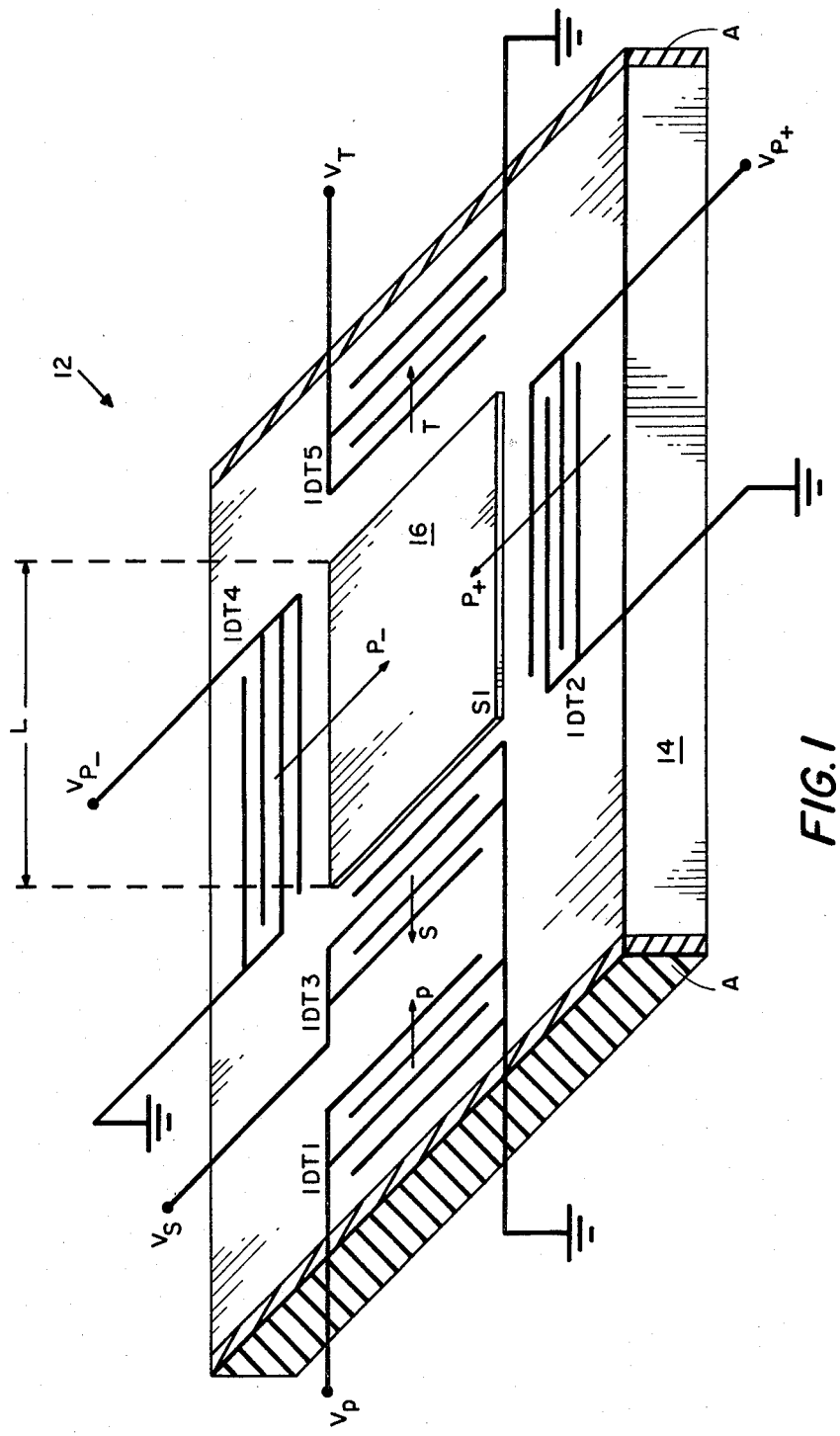
FIG. 1 is an isometric view of a first embodiment of the present invention.

Referring now to FIG. 1 the surface acoustic wave degenerate four-wave mixing phase-conjugate reflector 12 of the present invention will be described. The device 12 is formed on a piezoelectric substrate 14 which preferably is made of LiNbO$_3$. Other piezoelectric materials such as quartz may also be used. Charge coupling to a thin film of Si 16 deposited on the LiNbO$_3$ is used to obtain nonlinear interaction over a region of length L. The layer of silicon 16 may be disposed over the piezoelectric substrate 14 by any known techniques such as thin film deposition, air-gap (where the semiconductor silicon slab is held at a fixed distance, e.g. 0.5 micrometers above the piezoelectric substrate, by spacer bars), as well as monolithic construction in which a metal-oxide-semiconductor structure is made in layers by crystal growing and vapor deposition techniques. The particular method of construction of the silicon layer 16 should be judiciously chosen with regard to the desired application of the device.

On the top surface of the piezoelectric substrate 14 there is formed a first interdigital transducer IDT1. An externally supplied modulated voltage $V_p$ of specificied frequency drives the input interdigital transducer IDT1 to generate the probe wave, p. An output interdigital transducer IDT3 is colinearly aligned with the input transducer IDT1 and has an output terminal $V_S$ as indicated in FIG. 1. $V_p$ is a modulated carrier wave signal having a center frequency $f_1$. The input signal may be either phase or amplitude modulated.

In acordance with the present invention, a standing wave is generated in the nonlinear interaction region 16 by means of counterpropagating pump waves. In the embodiment illustrated in FIG. 1, the counterpropagating pump waves are generated by a first pump wave interdigital transducer IDT2 and a second counterpropagating pump wave interdigital transducer IDT4. The interdigital transducer IDT2 is connected to an unmodulated voltage supply $V_{P+}$ as is illustrated. Similarly, the interdigital transducer IDT4 is connected to the unmodulated voltage source $V_{P-}$ also having center frequency $f_1$.

Another interdigital transducer IDT5 is disposed on the substrate 14 on the side of layer 16 opposite that of the transducers IDT1 and IDT3 and colinearly aligned with them. Absorbing boundaries A are placed at the ends of the device 12 near the interdigital transducers IDT1 and IDT5 to remove edge-reflected waves. RTV, a silicon rubber, is a suitable material for A.

Figure 2:
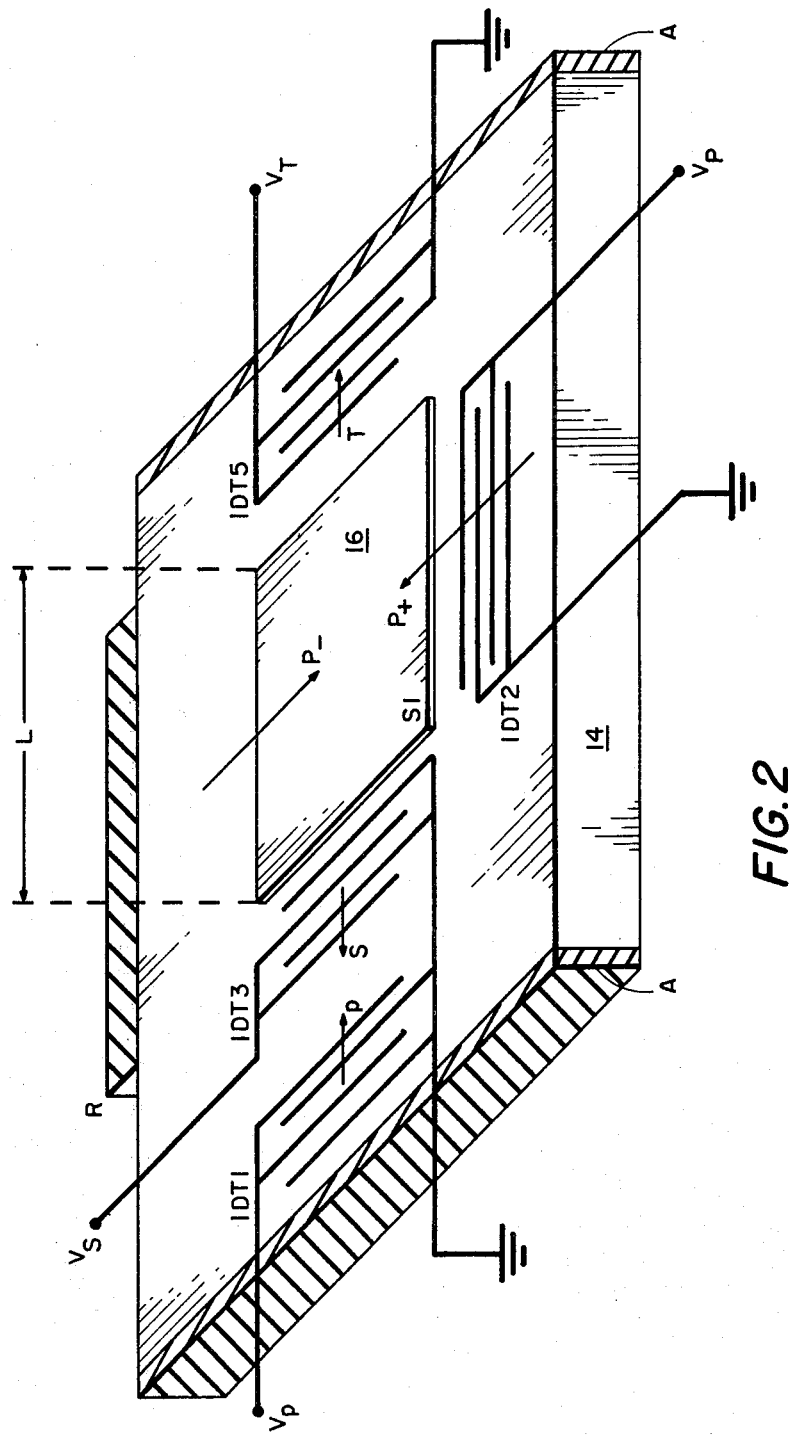
FIG. 2 is an isometric view of a second embodiment of the present invention.

In FIG. 2, there is illustrated an alternate embodiment of the present invention. FIG. 2 is identical to FIG. 1 except that the interdigital transducer IDT4 and the voltage supply $V_{P-}$ have been replaced by the reflector R (which may, for example, be an aluminum plate) mounted opposite the pump transducer IDT2. In this embodiment the counterpropagating pump wave $P_-$ is generated not by a voltage source but rather by the reflector R reflecting the wave $P_+$.

Referring to FIGS. 1 and 2 the operation of the device 12 will now be described. The externally supplied voltage $V_p$ drives the input interdigital transducer IDT1 to generate the probe wave p. The reflected phase-conjugated signal s is received by the interdigital transducer IDT3 and the transmitted wave t is received by transducer IDT5. The pump transducer IDT2 is driven by a steady state waveform $V_{P+}$ at the same frequency as the center frequency of the input signal from source $V_p$. As a result of the counterpropagating wave generated by voltage source $V_{P-}$ and the interdigital transducer IDT4 in the embodiment of the FIG. 1, and the reflector R in the embodiment of FIG. 2, a standing wave is set up under the Si layer 16. The angle of pump wavefronts relative to the probe wavefronts does not affect the basic operation but does influence the gain of the device. Thus, although the pump waves have been illustrated in FIGS. 1 and 2 as orthogonal to the probe wave, the pump waves, in general, need not be propagated orthogonal to the ingoing probe wave and in fact it is preferable that they are not orthogonal. The closer the pump waves are to being colinear with the probe wave, the greater is the dimension of the nonlinear interaction region and hence, the device efficiency is improved. Moreover, in the case where the input probe wave is frequency modulated, it should be noted that the instantaneous frequency of the probe is assumed to be sufficiently close to the center frequency of the pump wave that significant loss is not incurred in the reflectivity because of off-resonance operation. Also, if pulsed inputs are utilized rather than steady-state inputs and the input transducer IDT1 is located sufficiently far from the region of nonlinear interaction, there will be no need to filter out possible second harmonic signals generated by the pump standing wave as well as the forward going probe wave fields present at the transducer IDT3 simultaneously with the reflected signal. Where steady state inputs are utilized, however, external electronic circuitry (not shown) may be necessary to filter out these possible second harmonic signals.

For the device 12, the reflected wave or signal s is produced at the incident frequency and wavelength which propagates oppositely to the input probe p. Its complex modulation envelope $v_s$ is proportional to the complex conjugate of the input envelope $v_p$ as in the nonlinear optical case. The governing equations are $$dv_s^*/dz = ikv_p, \tag{1a}$$

$$dv_p/dz = ikv_s^*, \tag{1b}$$

where $k = \beta v_p^2$, $\beta$ being the third-order nonlinear coupling coefficient, whose value depends on the method of construction i.e. air-gap, thin film, or monolithic, and $v_p^2$ is the pump wave intensity, $i = (-1)^{\frac{1}{2}}$, z is the direction of propagation of the probe, and the asterisk denotes complex conjugation. These equations are derivable under the assumptions of adiabatically varying envelopes, i.e., small change in $v_s$ or $v_p$ over one acoustic wavelength, uniform pump isonification, negligible pump depletion, and steady-state operation. The solution of equations (1a) and (1b) is subject to the boundary conditions corresponding to a prescribed input; at the input edge of the nonlinear interaction region, the value of $v_p$ is given as $v_p(0)$, and at the exit edge $v_s = 0$. The solution for these boundary conditions is $$v_s(z) = i(|k|/k) \frac{\sin|k|(L-z)}{\cos|k|L} v_p^*(0), \tag{2a}$$

$$v_p(z) = \frac{\cos|k|(z-L)}{\cos|k|L} v_p(0). \tag{2b}$$

Equations (2) above give the steady-state response and indicate that for degenerate operation (probe and pump waves at exactly the same frequency) the gain $G = |v_s(0)/v_p(0)|^2$ (where z=0 is the entrance surface of the nonlinear interaction region) is $$G = \tan^2|k|L. \tag{3}$$

For nearly degenerate operation (probe and pump waves at slightly different frequencies) the gain is $$G = \frac{|k|L^2\tan^2(\beta L)}{|k|L^2 + (\Delta kL/2)^2\sec^2(\beta L)}, \quad (4)$$

where $\beta[|k|^2+(\Delta k/2)^2]^{\frac{1}{2}}$, $\Delta k=2n\delta/c$, c/n is the phase velocity of the surface waves, $\delta$ is the difference between pump and probe frequencies, and equal powers have been assumed in each pump direction of propagation. In addition, the slowly-varying envelope equations which include time-dependence of the probe and signal show that for nearly degenerate operation the reflected signal frequency is shifted by the same magnitude with respect to the pump as the input probe frequency but with the opposite sign.

Equations (2b) and (4) above indicate the narrowband nature of the gain, with an increase in pump power causing a narrowing of the frequency passband. They also show the phase-conjugating nature of the reflected wave. This causes the reflected wave to act as a "time-reversed" image of the input wave, in the sense that a pertubation of an incident probe wavefront will be inverted spatially on the reflected wavefront. Hence, upon propagation back through the medium initially responsibe for the perturbation, the reflected signal will be restored to its undistorted form, e.g., planar wavefronts.

For pulsed operation, previous work (J. H. Marburger, Appl. Phys. Lett. 32, 372 (1978)) has shown that if the input pulse is shorter than twice the length of the region of nonlinear interaction, L, and if the pump power is sufficiently small so that the higher order terms in the pump power are negligible, then the reflected signal at the input surface of the nonlinear region is $$v_s(t) = -(\tfrac{1}{2})ik \int_{t-2L/v}^{t} v_{po}^*(t')dt', \quad (5)$$

where $v_{po}(t)$ is the input pulse shape at the input surface $z=0$. This result, which holds if $|k|L<<1$, implies that a chirp (frequency sweep) on an input pulse can be effectively reversed over the main part of the reflected signal.

When the pump power is large enough that $|k|L=\pi/2$, the theoretical steady-state gain expression diverges, implying that the output can be finite for zero input, and the device should exhibit self-oscillation, in analogy with backward-wave oscillators.

In summary, the acoustic wave device disclosed, compared to microwave backward-wave amplifiers, requires less power and space, and operates in the frequency range of importance for satellite and TV communication channels. In addition, the degenerate four-wave mixing method produces unique phase conjugate reflections under less stringent operating conditions than alternate methods. This is accomplished by the use of two counterpropagating, degenerate pump waves to provide phase-conjugation as well as parametric amplification of both forward-traveling and backward-traveling waves.

Obviously, many other modifications and variations of the present invention are possible in the light of the above teachings. It is therefore to be understood that within the scope of the appended claims the invention may be practiced otherwise than as specifically described.

What is claimed is:

1. An acoustic surface wave device comprising:
   a piezoelectric substrate for propagating acoustic waves;
   a first transducer disposed on said substrate for receiving a modulated input signal having a carrier center frequency $f_1$ and for converting said input signal to an input acoustic wave;
   a second transducer colinearly aligned with said first transducer;
   a semiconductor material disposed over said piezoelectric substrate and having a dimension L colinear with said first and second transducers and defining a nonlinear acoustic wave interaction region;
   means for generating an acoustic standing wave having a frequency $f_1$ in said nonlinear interaction region whereby said input acoustic wave interacts with said standing wave in said nonlinear interaction region to create an output signal on said second transducer that is the phase conjugate of said modulated input signal.

2. The device of claim 1 wherein said second transducer is positioned between said semiconductor material and said first transducer.

3. The device of claim 1 further comprising:
   a third transducer colinearly aligned with said first and second transducers; and
   said semiconductor material being positioned between said second and third transducers.

4. The device of claims 1, 2 or 3 wherein:
   said acoustic standing wave generating means comprises a first pump transducer disposed on said piezoelectric substrate for receiving a pump signal having a frequency $f_1$ and for generating a pump acoustic wave and further comprises means for generating an acoustic wave that counterpropagates with respect to said pump acoustic wave so as to generate said acoustic standing wave.

5. The device of claim 4 wherein said means for generating said counterpropagating acoustic wave comprises a second pump transducer disposed on said piezoelectric substrate colinear with said first pump transducer.

6. The device of claim 4 wherein said means for generating said counterpropagating acoustic wave comprises a reflector affixed to said piezoelectric substrate and disposed so as to reflect said pump acoustic wave.

7. The device of claim 1 wherein:
   said piezoelectric substrate has a first boundary adjacent said first transducer; and
   said device further comprises a layer of acoustic wave absorber material disposed on said substrate adjacent said first boundary.

8. The device of claim 3 wherein:
   said piezoelectric substrate has a first boundary adjacent said first transducer and a second boundary adjacent said third transducer; and
   said device further comprises a first layer of acoustic wave absorber material disposed on said substrate adjacent said first boundary and a second layer of acoustic wave absorber material disposed on said substrate adjacent said second boundary.

9. The device of claims 1, 2, or 3 wherein said substrate is comprised of $LiNbO_3$.

10. The device of claims 1, 2, or 3 further comprising:
    a first signal source connected to said first transducer for generating said modulated input signal; and
    a second signal source connected to said acoustic standing wave generating means.

11. The device of claim 10 further comprising:
    a third signal source connected to said acoustic standing wave generating means.

* * * * *

UNITED STATES PATENT AND TRADEMARK OFFICE
CERTIFICATE OF CORRECTION

PATENT NO. : 4,379,998
DATED : April 12, 1983
INVENTOR(S) : Richard C. Shockley

It is certified that error appears in the above-identified patent and that said Letters Patent is hereby corrected as shown below:

On The Title Page:

Assignee should read -- United States of America as represented by the Secretary of the Navy --.

"Attorney, Agent or Firm - William D. Mooney; Herbert D. Knudsen; Larry W. Evans" should read -- Attorney, Agent or Firm - Robert F. Beers; Ervin F. Johnston; Harvey Fendelman --.

Signed and Sealed this

Seventeenth Day of January 1984

[SEAL]

Attest:

GERALD J. MOSSINGHOFF

Attesting Officer

Commissioner of Patents and Trademarks